United States Patent [19]

McElroy

[11] 4,187,602
[45] Feb. 12, 1980

[54] STATIC MEMORY CELL USING FIELD IMPLANTED RESISTANCE

[75] Inventor: David J. McElroy, Houston, Tex.

[73] Assignee: Texas Instruments Incorporated, Dallas, Tex.

[21] Appl. No.: 910,246

[22] Filed: May 30, 1978

Related U.S. Application Data

[62] Division of Ser. No. 754,208, Dec. 27, 1976, Pat. No. 4,092,735.

[51] Int. Cl.² .................................................. B01J 17/00
[52] U.S. Cl. ..................................... 29/571; 29/577 R; 357/59; 29/576 C
[58] Field of Search .................. 29/571, 577, 576 OC; 357/59

[56] References Cited

U.S. PATENT DOCUMENTS

| | | | |
|---|---|---|---|
| 3,570,114 | 3/1971 | Bean | 29/577 |
| 3,889,358 | 6/1975 | Bierhenke | 29/571 |
| 3,996,657 | 12/1976 | Simko | 29/571 |
| 4,033,026 | 7/1977 | Pashley | 29/571 |

*Primary Examiner*—W. C. Tupman
*Attorney, Agent, or Firm*—John G. Graham

[57] ABSTRACT

A cell for a semiconductor memory of the static type employs two conventional MOS transistors along with a field implanted resistance which functions as a grounded-gate junction FET. Along with other resistor elements, these devices provide a grounded-gate amplifier with voltage gain and a source follower, creating a circuit which is stable with either a "1" or "0" stored. No clock or other refresh circuitry is needed.

8 Claims, 6 Drawing Figures

STATIC MEMORY CELL USING FIELD IMPLANTED RESISTANCE

This application is a divisional of copending application Ser. No. 754,208, filed Dec. 27, 1976, now U.S. Pat No. 4,092,735.

BACKGROUND OF THE INVENTION

This invention relates to semiconductor memory devices and more particularly to a static memory cell made of MOS transistors.

The most widely used semiconductor memory devices at present are one-transistor dynamic memory cells as described in U.S. Pat. 3,940,747, issued Feb. 24, 1976 to Kuo and Kitagawa, assigned to Texas Instruments. Higher density versions of these dynamic memory systems are shown in Electronics, May 13, 1976, pp. 81–86 and U.S. patent application Ser. No. 691,734, filed June 1, 1976 by Lionel White and N. Kitagawa, assigned to Texas Instruments. These high density devices use one-transistor dynamic memory cells which have the advantage of very small size, but require sense amplifiers capable of distinguishing a few hundred millivolts, and dissipate considerable power in large arrays; primarily, however, dynamic memories suffer from the disadvantage of requiring external refresh systems. The arrays must be addressed periodically to restore the data, since the stored voltages will leak off the capacitors in the memory cells, imposing both time and hardware burdens on the system. Static memory cells of the type set forth in copending application Ser. No. 691,252, filed May 28, 1976, by G. R. Mohan Rao, assigned to Texas Instruments, avoid the need for refresh, but at the expense of larger cell size and increased power dissipation. Various types of "self-refreshing" cells have been proposed, one example of which is shown in Digest of Technical Papers, 1976 IEEE Solid State Circuits Conference, p. 132, on Automatic Refresh Dynamic Memory. Another is shown in U.S. Pat No. 3,955,181, issued May 4, 1976 to Joseph H. Raymond, Jr., for Self-Refreshing Random Access Memory Cell, assigned to Texas Instruments. A self-refresh RAM cell of very simple construction is shown in pending U.S. patent application Ser. No. 700,989, filed June 29, 1976, by G. R. Mohan Rao, David J. McElroy and Gerald D. Rogers, assigned to Texas Instruments. These prior cells provide apparently static operation in that refresh is accomplished without addressing the cells. Prior self-refresh cells, however, have exhibited either large cell size or excessive power dissipation, neither of which is compatible with high density memories of the 4 K or 16 K variety. Others have required clocking or other timing signals, or have exhibited a high degree of process dependence on Vt or other parameters, i.e. low yield.

It is a principal object of this invention to provide improved memory cells in semiconductor integrated circuits. Another object is to provide an improved static cell for MOS memory devices, particularly a static cell of small size and not requiring clock inputs. An additional object is to provide small area, self-refreshing memory elements in semiconductor integrated circuits, particularly with low power dissipation and made by processes compatible with MOS/LSI standard products.

SUMMARY OF THE INVENTION

In accordance with this invention, a memory cell is provided which includes a read/write or transfer transistor which is connected between the bit line and a storage node. The storage node is connected to a voltage supply through a refresh or sustaining transistor, and the gate of this transistor is a feedback node. A field implanted resistor connects this gate to the storage node, and this resistor switches between a high impedance state and a low impedance state depending upon whether a "1" or a "0" is stored. The resistor is provided by an ion implanted region located beneath a thick silicon oxide layer grown after the implant step. In an N-channel MOS process, the oxide layer would be "field oxide". In making the resistor, the first area which is to form the resistor element is implanted, using an appropriate mask, then field oxide is grown. The upper srface of the implanted region is consumed as the field oxide is grown; the remaining implanted material is of very high resistivity. For example, reproducible results at 1 megohm per square have been achieved, as set forth in said pending application Ser. No. 691,252. This field implanted resistor functions as a grounded-gate junction FET, which, along with a resistor between the feedback node and the voltage supply, provides a grounded-gate amplifier stage with voltage gain. The refresh transistor, along with a resistor element connected between the storage node and ground, provide a source follower stage. The two stages create a static flip-flop which is stable with either a "1" or a "0" on the storage node. Thus, two conventional MOS transistors and one field-implanted resistor, along with two other resistor elements, provide a static cell, with no clock voltages required.

BRIEF DESCRIPTION OF THE DRAWINGS

The novel features believed characteristic of the invention are set forth in the appended claims. The invention itself, however, as well as other features and advantages thereof, will be best understood by reference to the following detailed description of illustrative embodiments, read in conjunction with the accompanying drawings, wherein:

DETAILED DESCRIPTION OF SPECIFIC EMBODIMENT

Figure 1:
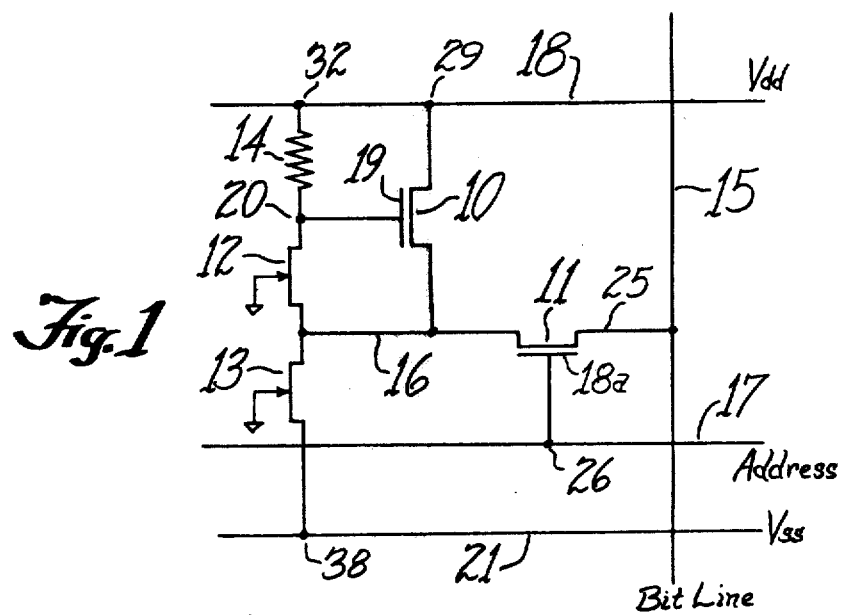
FIG. 1 is an electrical schematic diagram of the static memory cell of the invention.

With reference to FIG. 1, a memory cell according to the invention includes a pair of MOS transistors 10 and 11 and a pair of field implanted resistors 12 and 13, along with a resistor 14 which is preferably of the implanted poly type. The transistor 11 is a transfer or input/output device and is connected between a bit line 15 and a storage node 16. An address line 17 is connected to the gate 18a of the transistor 11. The transistor 10 functions as a sustaining device and is connected between a voltage supply line 18 and the storage node 16. The gate 19 of the transistor 10 is connected to a feedback node 20, to which the field-implanted resistor 12 and the resistor 14 function as a grounded-gate JFET amplifier input. The resistor 13, connected to a ground or Vss line 21, acts as a load impedance for a source follower stage comprising the transistor 10 and the resistor 13, with the node 16 being its output. The cells could be duplicated in an array by reflecting about the Vdd and Vss lines 18 and 21 so adjacent cells share Vdd and Vss conductors.

Figure 2:
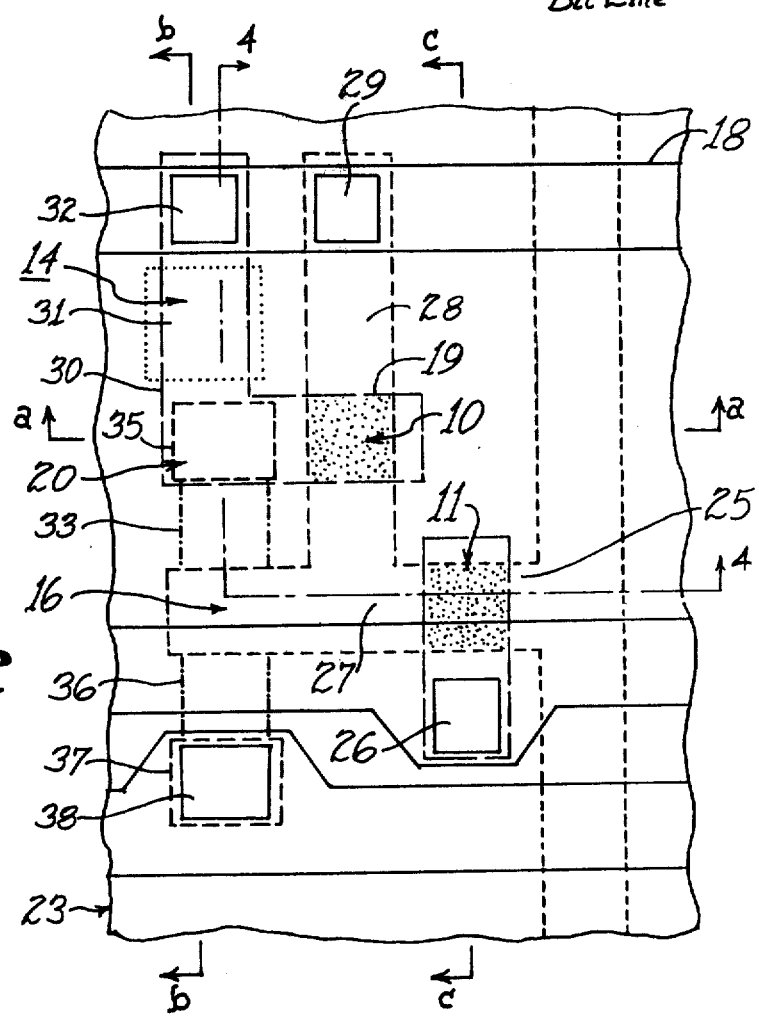
FIG. 2 is a greatly enlarged plan view of a small portion of a semiconductor chip showing the physical layout of the cell of FIG. 1 using field implanted resistors according to the invention.

In FIG. 2, and the associated sectional views of FIGS. 3a to 3c, an MOS cell layout is shown incorporating the memory cell of FIG. 1. A very small part 23 of a semiconductor bar is seen, it being understood that a memory device would usually contain perhaps 4096 or 16384 of the cells on a silicon chip of less than one-tenth square inch. The Vdd and Vss lines 18 and 21, as well as the address line 17, are metal strips overlying a silicon oxide insulating layer 24 on the top face of the chip. The bit line 15 is an elongated N+ diffused region within the silicon chip, and a part of this N+ region provides the source 25 of the transistor 11. The gate 18 of the transistor 11 is a doped polycrystalline silicon layer which is connected to the metal line 17 at a metal-to-poly contact area 26. The transistor 10 is formed by a continuation of the N+ diffused moat 27 which forms the drain of the transistor 11 and the node 16, along with an N+ diffused region 28 which extends to a metal-to-moat contact area 29. The gate 19 is formed by a doped polycrystalline silicon area 30 which also extends across a poly-to-moat contact area at the node 20 and forms the resistor 14 in an implanted area 31, terminating in a metal-to-poly contact area 32. An implanted region 33 beneath the thick field oxide 34 which surrounds the moats creates the resistor 12 between an N+ region 35 and an extension of the N+ moat region 27. Likewise, an implanted region 36 creates the resistor 13 beneath the field oxide 34 and the metal line 17. The region 36 terminates in an N+ diffused moat region 37 to which a metal-to-moat contact 38 is made to the metal Vss line 21.

The field-implanted resistors 12 and 31 are made by the method described in pending applications Ser. No. 691,252 filed May 28, 1976 by G. R. Mohan Rao, and Ser. No. 700,989, filed June 29, 1976 by G. R. Mohan Rao, David J. McElroy and Gerald D. Rogers, both assigned to Texas Instruments. The implanted polysilicon resistor 14 is made by the method described in pending application Ser. No. 727,116, filed Sept. 27, 1976 by G. R. Mohan Rao, John S. Stanczak, Jin-Chang Lien, and Shyam Bhatia, assigned to Texas Instruments. These methods will be described below.

In operation of the memory cell of FIGS. 1 and 2, the resistor 12 functions as a junction field effect transistor because it will exhibit a resistance value which is dependent upon its source voltage, i.e., upon the voltage existing on the node 16. When the voltage on the node 16 is high (a "1" stored), the depletion region created by the back-biased junction between the substrate and the implanted region 31 is wide and the apparent resistance exhibited by the device is very high, perhaps in excess of a megohm per square. When the voltage on the node 16 is low (a logic "0" stored), the apparent resistance is many orders of magnitude lower. The resistor 12 functioning in this manner, and the resistor 14, act as a grounded gate junction FET amplifier stage with voltage gain, node 16 being the input and node 20 being the output. The transistor 10 along with the resistor 13 function as a source follower stage, with node 20 as the input and the node 16 as the output. The grounded gate stage has enough DC voltage gain to make up the loss through the source follower, so the circuit is stable in either state and it acts as a static flip flop.

A "1" stored by addressing the line 17, turning on the transistor 11, and charging the node 16 from a "1" or Vdd voltage on the bit line 15. This causes the resistor 12 to exhibit very high impedance, so the current flow through the resistor 14 is very low and the node 20 is at near Vdd or above threshold Vt, holding the transistor 10 on. The node 16 charges from Vdd line 18 when the transistor 10 conducts, keeping the node 16 high, so a "1" is sustained. A "0" is stored when the bit line 15 is at Vss and the transistor 11 is addressed, discharging the node 16 into the bit line. When the node 16 is at Vss, the impedance of the resistor 12 is low, the current flow through and drop across the resistor 14 is high, so the node 20 is below Vt, turning off the transistor 10, so a "0" level is sustained on the node 16. Also, the load device 13 is in its low resistance state, so the node 16 is connected to the Vss line 21 by low impedance, further tending to enhance a "0" level.

Figure 3:
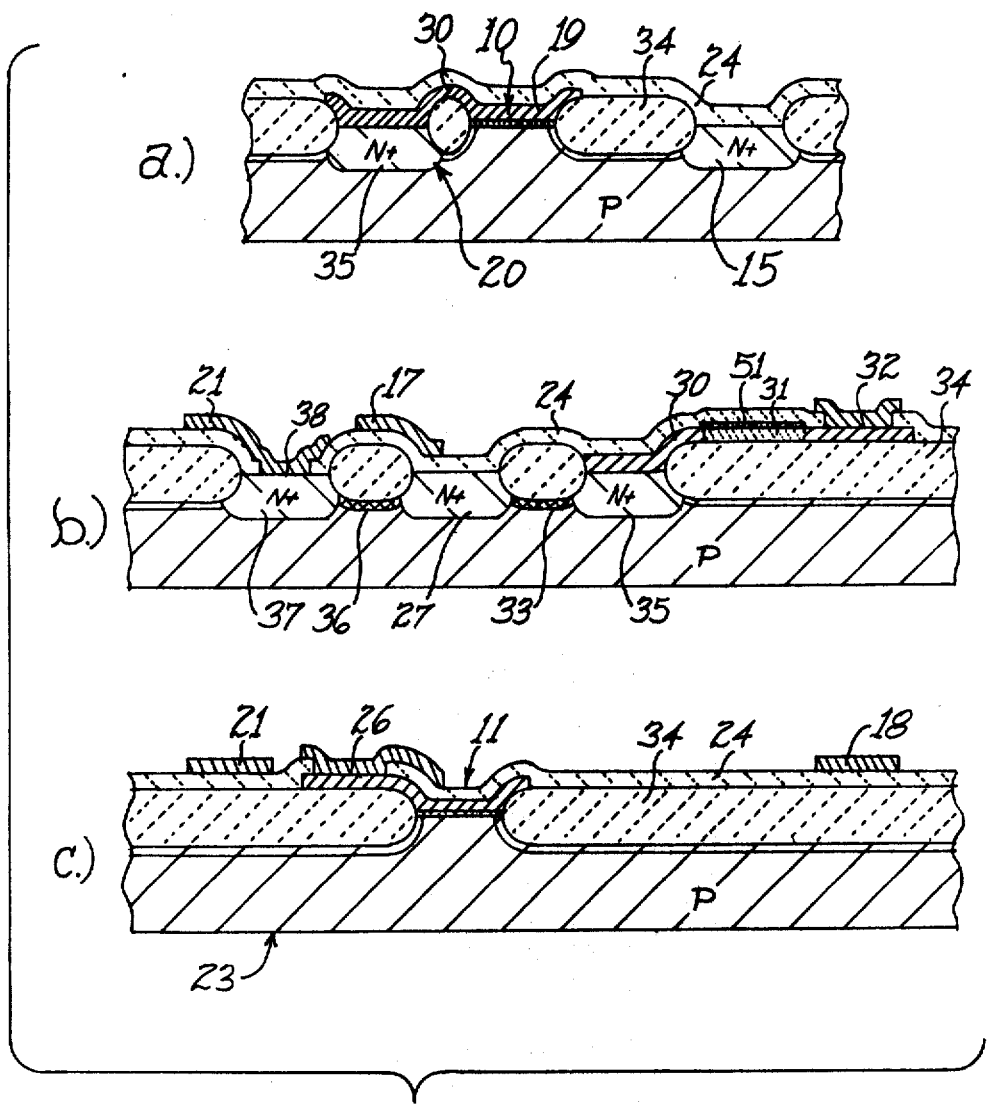
FIGS. 3a–3c are elevation views in section of the cell of FIG. 2, taken along the lines a—a, b—b, and c—c, respectively.
Figure 4:
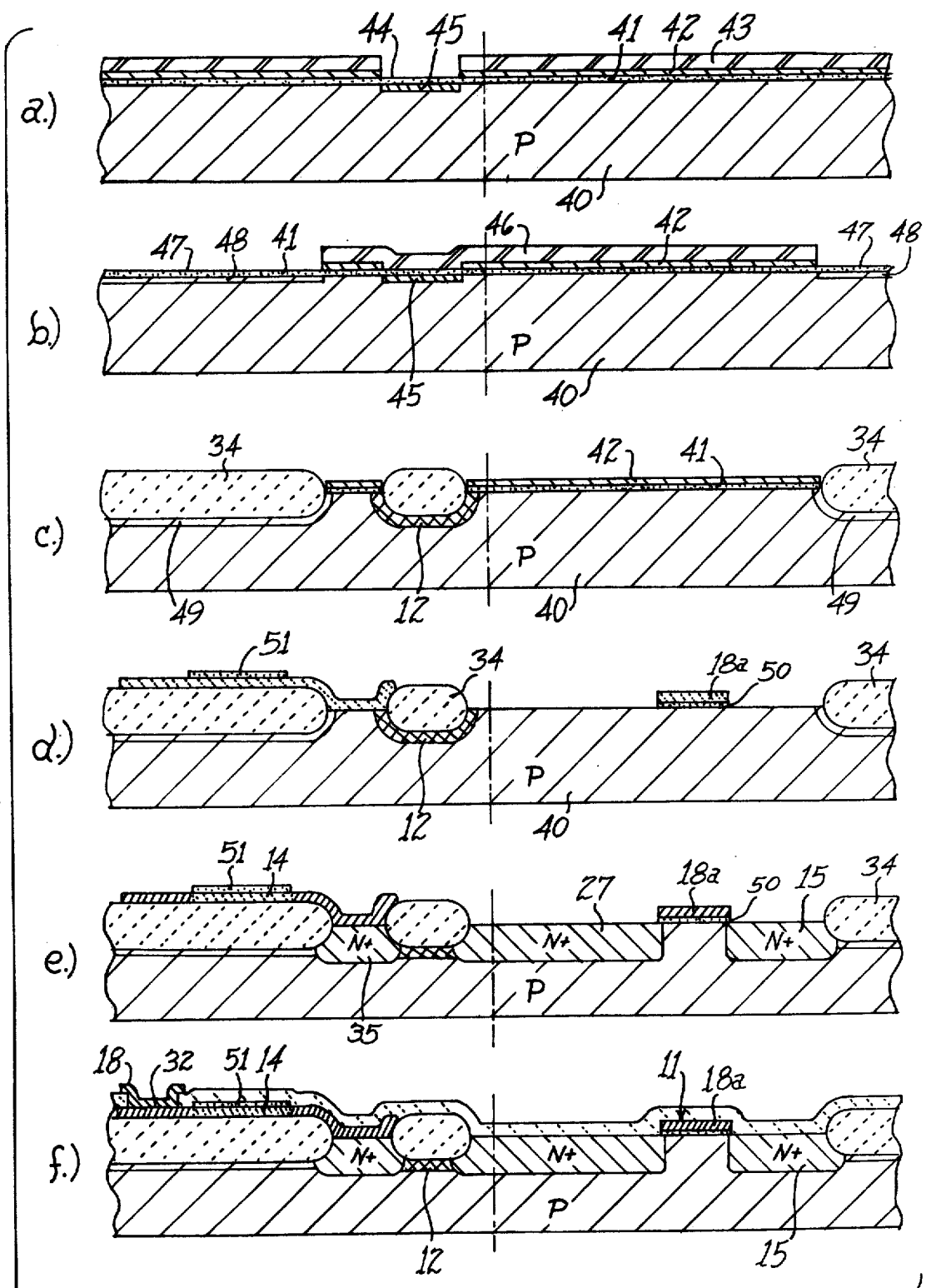
FIGS. 4a–4f are elevation views in section of the semiconductor device of FIGS. 2 and 3a–3c, at successive states in the manufacturing process, taken along the line 4—4 in FIG. 2.

Referring now to FIGS. 4a-4f, a process for making the N-channel, silicon-gate, self-aligned MOS integrated circuit device of FIGS. 2 and 3a-3c will be described. FIGS. 4a-4f represent a sectional view along the line 4—4 of FIG. 2, chosen to illustrate formation of a transistor, the field-implanted registor 12, and the implanted poly resistor 14. The starting material is a slice of P-type monocrystalline silicon, perhaps 3 inches in diameter and 20 to 40 mils thick, cut on the <100> plane, of a resistivity of about 6 to 8 ohm-cm. In FIGS. 2, 3 or 4, the part shown of a chip or bar 40 represents only a very small part of the slice, perhaps 2 or 3 mils wide. After appropriate cleaning, the slice is oxidized by exposing to oxygen in a furnace at an elevated temperature of perhaps 1000° C. to produce an oxide layer 41 of a thickness of about 1000 Å. Next, a layer 42 of silicon nitride of about 1000 Å thickness is formed by exposing to an atmosphere of silane and ammonia in an rf plasma reactor. A coating 43 of photoresist is applied to the entire top surface of the slice, then exposed to ultraviolet light through a mask which defines the desired pattern, and developed. This leaves an area 44 where nitride is to be etched away by a nitride etchant which removes the exposed part of the nitride layer 42 but does not remove the oxide layer 41 and does not react with the photoresist 43. In this area 44 the resistor 12 is to be formed.

The slice is now subjected to an ion implant step, whereby phosphorus atoms are implanted in an area 45 of silicon not covered by photoresist 43 and nitride 42 to create the resistor. The photoresist could have been removed, but preferably is left in place as it also masks the implant. The oxide layer 41 is left in place during the implant because it prevents the implanted phosphorus atoms from out-diffusing from the surface during subsequent heat treatment. This implant is at a dosage of about $5 \times 10^{10}/cm^2$ at 70 to 150 KeV. The selection of energy level used will provide a control over the cut-off voltage, with higher energy level providing a higher cut-off.

As will be seen, the region 45 does not exist in the same form in the finished device, because some of this part of the slice will have been comsumed in the field oxidation procedure.

Next, the photoresist coating 43 is removed and another photoresist coating 46 is applied over the entire slice, then exposed to UV light through a mask which exposes everything except what is to become the moats, i.e. the transistors and N+ diffused regions. Upon developing, unexposed photoresist is removed in areas 47 in FIG. 4b. The region 45 where resistor 12 will be created is covered. The nitride layer 42 is etched away in the areas 47, the oxide 41 is left in place as before, and then the slice is subjected to a boron implant at 100 KeV at a dosage of about $4 \times 10^{12}/cm^2$. Heavily doped P+ regions 48 will be produced in the surface to ultimately provide the channel stop regions. The remaining photoresist 46 then would be removed.

As set forth in copending patent application Ser. No. 648,593, filed Jan. 12, 1975 by G. R. Mohan Rao, assigned to Texas Instruments, the next step in the process is to subject the slice to a heat treatment or annealling step, during which the slice is maintained at a temperature of about 1000° C. for perhaps approximately 2 hours in an inert atmosphere, preferably nitrogen. This step causes the implanted boron and phosphorus concentrations to change markedly, which has desirable effects aside from reduction in bulk damage in the crystal structure. The P+ regions 48 as well as the N region 45 will have penetrated deeper into the silicon surface after anneal.

The following step in the process is formation of field oxide 34, which is done by subjecting the slices to steam or an oxidizing atmosphere at about 900° C. for perhaps 10 hours. This causes a thick field oxide region or layer 34 to be grown as seen in FIG. 5c, and this region extends into the silicon surface because silicon is consumed as it oxidizes. The nitride layer 42 masks oxidation beneath it. The thickness of this layer 34 is about 8000 to 10,000 Å, about half of which is above the original surface and half below. The boron doped P+ regions 48 and the phosphorus doped N region 45 formed by implant and modified by the anneal step will be partly consumed, but will also diffuse further into the silicon ahead of the oxidation front. Thus, P+ "channel-stop" regions 49 and the N resistor region 12 will result which will be deeper and of more uniform and acceptable concentration at the surface compared to what would have resulted without the anneal step. Also the regions 49 and 12 will not have the extent of crystalline structure damage characteristic of prior implanted devices.

The nitride layer 42 and its underlying oxide layer 41 are removed by etching, as the next step, and another thin oxide layer 50 of about 800 Å is grown over the exposed areas of silicon. This layer 50 later becomes the gate insulators of the transistors as well as capacitor dielectric if needed. Windows for polysilicon to silicon contacts are patterned and etched in the oxide layer 50 using photoresist. A layer of polycrystalline silicon is deposited over the entire slice in a reactor using standard techniques as by decomposition of silane in hydrogen at about 930° C. to a thickness of about 0.5 micron, producing polysilicon which will become the transistor gates and the strip 30.

The entire polysilicon coating is now subjected to a phosphorus implant creating the characteristics of the resistor 14. Areas of poly which are to be highly conductive will be later subjected to a phosphorus diffusion which will leave them highly doped. To define the resistor, this implant is at 100 to 150 KeV to a dosage of from $5 \times 10^{13}$ to $1 \times 10^{14}$ atoms per $cm^2$, depending upon the desired sheet resistivity. Following this implant, the slice is annealled in $N_2$ for 30 minutes at 1000° C. to distribute the phosphorus properly in the polysilicon.

The polysilicon and underlying gate oxide or thin oxide layers are next patterned by applying a layer of photoresist, exposing to ultraviolet light through a mask prepared for this purpose, developing, then etching with the remaining photoresist masking certain areas of the polysilicon. The resulting structure is seen in FIGS. 4d, where a part of the remaining polysilicon layer provides what will be the gate 18a of MOS transistor 11, and thin oxide 50 underneath it is the gate oxide of the transistor. These same layers also provide gate and gate oxide for all the other transistors on the slice, as well as capacitors. After patterning the poly, a protective cap of silicon dioxide is grown over the polysilicon, producing a coating 51 on all exposed surfaces of the poly, including tops and sides. The coating 51 is grown at about 900° C. in steam for perhaps two hours, producing approximately 3000 Å thickness and consuming part of the polysilicon. The cap is to prevent deposition of impurity on the resistors or diffusion into the resistors.

A photoresist mask and etch operation is next used to remove the coating 51 on all areas of the polysilicon except the resistor 14. The mask used to protect the resistor leaves oxide over the area defined by a dotted line 31 in FIG. 2; this is much wider than the resistor, allowing a rather wide margin for error in mask alignment. The resulting structure is seen in FIG. 4d.

Using the thin oxide 50, protective cap 51, and field oxide 34 as a diffusion mask, the slice is now subjected to an N+ diffusion, whereby phosphorus is diffused into the silicon slice 40 as seen in FIG. 4e to produce regions 15, 25, 27, 35 and 37. Phosphorus diffuses into the exposed polysilicon, so it becomes heavily doped and very conductive. The poly does not mask the diffusion, so an N+ region 35 is created beneath the poly. The depth of diffusion is about 8,000 to 10,000 Å. The N+ diffused regions function as conductors which connect the various regions together, and also function as the source or drain regions of all the MOS transistors.

As seen in FIG. 4f, fabrication of the device is continued by depositing another layer 24 of phosphorus-doped oxide. Rather than by oxidizing, this is done by a low temperature reaction process using conventional chemical vapor deposition techniques. The layer 24 is about 6,000 Å, covering the entire slice. Subsequently, windows are opened in the oxide layer 24 in areas 29, 32 and 38 where contact is to be made to regions of the silicon or to the polysilicon layer. Then, a layer of aluminum is deposited on the entire slice, and etched away using photoresist masking to provide the desired pattern of metal interconnections 17, 18 and 21.

Figure 5A:
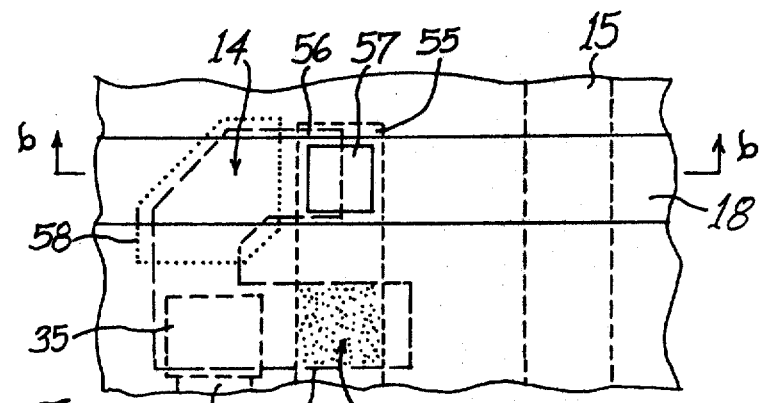
FIGS. 5a and 5b are plan and elevation views of an alternative contact layout which may be used in the cell of FIG. 2.
Figure 5B:
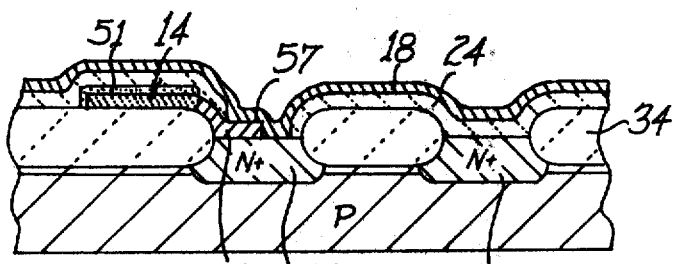

Referring to FIGS. 5a and 5b, a different way of making the metal-to-poly and metal-to-moat contacts to the Vdd line 18 is shown. The segment of FIG. 5a is the upper part of the cell of FIG. 2, all other parts being exactly the same as FIG. 2. The N+ diffused moat 55 above the transistor 10 extends beneath the metal line 18. The poly strip which forms the gate 19 of the transistor 10 extends across the N+ moat segment 35 to contact the field-implanted resistor 12, then continues up to provide the resistor 14 and on to a part 56 over the moat 55 and beneath a contact area 57. The same contact hole overlies both poly and moat so the contact area 57 makes both connections. The mask outline 58 for the poly resistor 14 is irregularly shaped and underlies the metal line 18. In this manner, space is saved in the layout so a more dense cell array may be provided.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A method of making an integrated circuit having first and second resistors and an active circuit element comprising the steps of: forming a first resistor in the face of a silicon body by ion implanting; growing thermal oxide over said first resistor; applying a layer of polysilicon on said face at least partially overlying the thermal oxide to define a second resistor and to define an electrode of said active circuit element; implanting the polysilicon with impurity to a low level of concentration to define the resistivity of the second resistor; and introducing impurity into the polysilicon layer in all areas except that of the second resistor to form low resistance connections and said electrode; the first and second resistors and the active circuit element being interconnected in a circuit.

2. A method according to claim 1 wherein a thin coating of thermal oxide is applied to the upper surface of the layer of polysilicon to mask the resistor and impurity is introduced by diffusion.

3. A method according to claim 1 wherein the second resistor and the gate are integrally connected together.

4. A method according to claim 2 wherein impurity is also simultaneously diffused into a region of said face of the silicon body.

5. A method of making electrical connection simultaneously to a region of a face of a semiconductor body and to a strip of polycrystalline silicon on said face, comprising the steps of: exposing a contact area on said face of the body over said region, with the surrounding area on said face being covered with an insulating coating; depositing a strip of polycrystalline silicon over the insulating coating and extending into the contact area but not covering said contact area; applying another insulating coating on said face over the polycrystalline silicon and opening an aperture over the contact area to expose a portion of the region and to expose a portion of the polycrystalline silicon over the region; and applying a strip of metal to said face extending along the insulating coating and into the aperature at the contact area to engage said portion of the region and said portion of the polycrystalline silicon to provide said electrical connection.

6. A method according to claim 5 wherein impurity is diffused into the polycrystalline silicon and into said region of the face at the same time.

7. A method according to claim 5 wherein the step of depositing a strip of polycrystalline silicon includes at the same time forming the gate of a field effect transistor on said face.

8. A method according to claim 7 wherein the gate is integrally connected to a resistor area of the strip which is doped more lightly than the gate.

* * * * *